United States Patent [19]

Piccone

[11] Patent Number: 5,614,737
[45] Date of Patent: Mar. 25, 1997

[54] MOS-CONTROLLED HIGH-POWER THYRISTOR

[75] Inventor: Dante E. Piccone, Glenmoore, Pa.

[73] Assignee: Silicon Power Corporation, Malvern, Pa.

[21] Appl. No.: 504,335

[22] Filed: Jul. 19, 1995

[51] Int. Cl.$^6$ .................................................. H01L 29/74
[52] U.S. Cl. ........................ 257/124; 257/107; 257/115; 257/119; 257/121; 257/133; 257/139; 257/146
[58] Field of Search .................................. 257/107, 115, 257/119, 121, 124, 133, 139, 146

[56] References Cited

U.S. PATENT DOCUMENTS 5,005,065  4/1991  Piccone et al. ................................. 357/38

OTHER PUBLICATIONS

Temple et al, MOS–Controlled Thyristor (MCT) Power Switches, No Date.
Power Conversion Intelligent Motion, Nov. 1992, pp. 9–16.
U.S. Application Ser. No. 08/381,766—Piccone et al filed Feb. 1, 1995.

Primary Examiner—Edward Wojciechowicz
Attorney, Agent, or Firm—William Freedman

[57] ABSTRACT

This thyristor comprises a main current-carrying portion in the form of a semiconductor body having four layers, with contiguous layers being of different P and N conductivity types and with three back-to-back PN junctions between contiguous layers. One end layer constitutes an anode layer, an opposite end layer constitutes a cathode layer, and an intermediate layer contiguous with the cathode layer constitutes a gate layer. The cathode layer is divided into many elongated fingers, thereby dividing the PN junction between the cathode layer and the gate layer into many discrete PN subjunctions between the fingers and the gate layer. These subjunctions are effectively in parallel with each other so as to share the main current through the thyristor when the thyristor is "on". The gate layer has predetermined surface regions adjacent the cathode layer that are uncovered by the cathode-layer fingers and that respectively surround the PN subjunctions between the fingers and the gate layer. A gate electrode in ohmic contact with the gate layer in said predetermined surface regions of the gate layer surrounds the PN subjunctions between said fingers and said gate layer. The main current-carrying portion further comprises a cathode electrode having portions respectively registering with and in ohmic contact with the cathode-layer fingers.

10 Claims, 2 Drawing Sheets

MOS-CONTROLLED HIGH-POWER THYRISTOR

FIELD OF THE INVENTION

This invention relates to a high-power thyristor and, more particularly, to a high-power thyristor of the type in which turn-off of the thyristor is effected by shorting out, or bypassing, one of the PN junctions in the main current path through the thyristor.

BACKGROUND

A typical thyristor of the above type is the MOS-controlled thyristor (MCT) described in a paper by V. A. K. Temple et al appearing in the November 1992 issue of Power Conversion Intelligent Motion, pp. 9–16. Another example of such a thyristor is disclosed and claimed in U.S. patent application Ser. No. 08/381,766—Piccone et al, filed on Feb. 1, 1995, and assigned to the assignee of the present invention. Each of these thyristors comprises a multi-layer semiconductor body having four layers, with contiguous layers being of different P and N conductivity types, with each end layer constituting an emitter layer and the two intermediate layers constituting base layers, the upper base layer serving also as a gate layer. The upper emitter layer is of an arrayed cellular construction. When the thyristor is in its "on" state, current flows in series through these four layers, passing in parallel paths through the cells of the upper emitter layer. Turn-off of this thyristor is effected by relying upon field-effect transistors that are respectively integrated into all the cells of the upper emitter layer. These field-effect transistors are non-conducting when the thyristor is in its "on" state, but each is switchable into a conducting state that results in the field-effect transistor effectively bypassing its associated upper base-upper emitter PN junction, thereby turning off the thyristor.

In each of the above-described thyristors, each cell of the thyristor includes a field-effect transistor integrated into the cell, with certain components of the cell serving also as some of the components of the field-effect transistor. One disadvantage of this type of construction is that manufacture of the field-effect transistors must be performed by integrated-circuit fabricating procedures, and because the transistors are integrated into the cells of the thyristor, the whole thyristor is required to be fabricated by such procedures. Integrated-circuit fabricating procedures are much more demanding from precision and cleanliness standpoints than are the procedures normally used for fabricating high-power thyristors. Hence, fabricating the above-described prior MOS-controlled thyristors becomes a very expensive proposition as compared to fabricating more conventional comparably-rated high-power thyristors.

OBJECT

An object of my invention is to construct a MOS-controlled thyristor is such a manner that there is no need to rely upon expensive integrated-circuit fabricating procedures for manufacturing the portion of the thyristor that carries the main current when the thyristor is in its "on" state.

Another object is to provide, in a MOS-controlled thyristor having one of its PN junctions divided into a plurality of parallel-connected subjunctions, simple and effective means for developing a low-resistance bypass around the subjunctions when it is desired to turn off the thyristor.

SUMMARY

In carrying out the invention in one form, I construct the main current-carrying portion of the thyristor in the form typically used in a gate turn-off thyristor, as exemplified, for example, by that disclosed in my U.S. Pat. No. 5,005,065, assigned to the assignee of the present invention. This main current-carrying portion comprises a multi-layer semiconductor body having four layers, with contiguous layers being of different P and N conductivity types and with three back-to-back PN junctions between contiguous layers. One end layer constitutes an anode layer, an opposite end layer constitutes a cathode layer, and an intermediate layer contiguous with the cathode layer constitutes a gate layer. The cathode layer is divided into many elongated fingers, thereby dividing the PN junction between the cathode layer and the gate layer into many discrete PN subjunctions between the fingers and the gate layer. These subjunctions are effectively in parallel with each other so as to share the main current through the thyristor when the thyristor is "on". The gate layer has predetermined surface regions adjacent the cathode layer that are uncovered by the cathode-layer fingers and that respectively surround the PN subjunctions between the fingers and the gate layer. A gate electrode in ohmic contact with the gate layer in said predetermined surface regions of the gate layer surrounds the PN subjunctions between said fingers and said gate layer. The main current-carrying portion further comprises an anode electrode in ohmic contact with the anode layer and a cathode electrode having portions respectively registering with and in ohmic contact with said cathode-layer fingers.

For imparting turn-off ability to this main current-carrying portion, I provide one or more MOS-type field-effect transistors connected between said cathode electrode and said gate electrode and located in one or more areas of the thyristor separate from said cathode-layer fingers. Each field-effect transistor is normally in a high-resistance state when the thyristor is "on" but is switchable to a low-resistance "on" state, thereby developing a low-resistance bypass around said P-N subjunctions and turning off said thyristor. The field-effect transistor or transistors are discrete components that can be fabricated separately from the main current-carrying portion of the thyristor and then connected between said cathode electrode and said gate electrode.

DETAILED DESCRIPTION OF EMBODIMENTS

Figure 1:
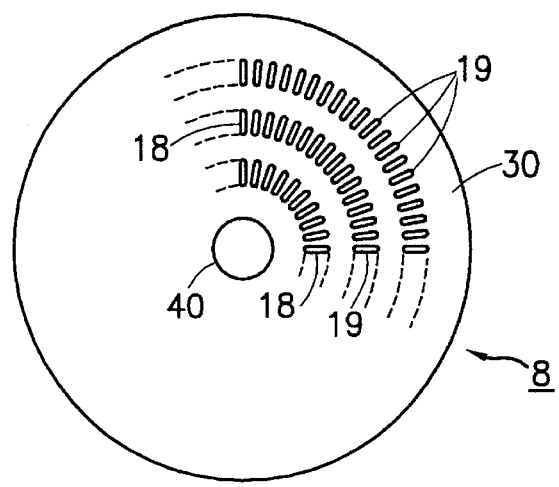
FIG. 1 is a plan view of the multi-layer wafer of a MOS-controlled thyristor embodying one form of my invention, as viewed from the cathode side of the wafer.
Figure 2:
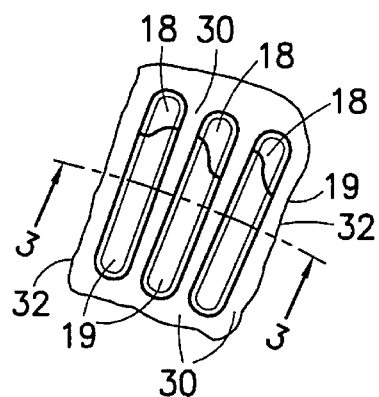
FIG. 2 is an enlarged view of a portion of the thyristor of FIG. 1 showing several side-by-side cathode layer (or emitter layer) fingers.
Figure 3:
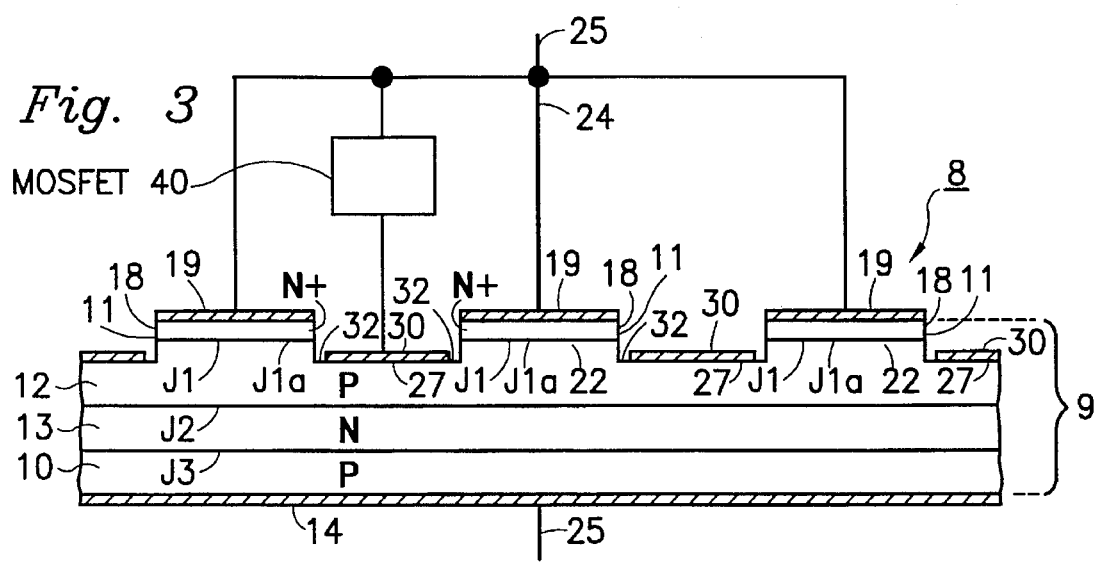
FIG. 3 is an enlarged sectional view taken along the line 3—3 of FIG. 2, with certain added elements shown schematically.

Referring now to FIGS. 1–3, the thyristor 8 comprises a thin, circular multi-layer wafer 9 of silicon comprising four layers of alternately-opposite P and N conductivity types, with three PN junctions between contiguous layers. These four layers comprise end, or outer, anode and cathode layers 10 and 11 of P and N type silicon, respectively, and intermediate base layers 12 and 13 of P and N type silicon, respectively, thus forming three PN junctions J1, J2, J3 in series between opposite faces of the wafer. The cathode, or emitter, layer 11 is highly doped with donor impurity, for example, to a concentration of about $10^{21}$ atoms per cubic centimeter and is indicated in FIG. 1 as of $N^+$ material. The base layer 12 contiguous to cathode layer 11 is doped with acceptor impurities, is lightly doped, and is indicated in FIG. 3 as of P type material. The PN junction J1 is located between base layer 12 and the cathode layer, or emitter layer 11. The base layer 12 is also referred to herein as a gate layer.

On the outer surface of the P type anode layer 10 there is formed, as by alloying, a thin layer 14 of aluminum constituting an anode electrode that is in ohmic contact with the anode layer. At the opposite face of the wafer, the $N^+$ type cathode layer is divided into a large number of narrow elongated fingers 18. In the illustrated form of the invention, these fingers 18 extend radially of the circular silicon disc and are arranged in a plurality of ring-shaped arrays concentrically disposed about the center of the wafer, as best shown in FIG. 1. On the outer surface of each of these fingers 18 in ohmic contact therewith is a thin layer 19 of aluminum registering with the finger. These thin layers 19 of aluminum collectively constitute the cathode electrode of the overall thyristor. As shown in FIG. 3, disposed beneath each of the fingers 18 of $N^+$ material is a projection, or mesa, 22 formed from the P type base layer 12 and extending upwardly from the surrounding region of the base layer 12. It will be apparent from FIG. 3 and the above description of parts 18, 19 and 22 that the PN junction J1 is divided into a plurality of parallel-connected subjunctions respectively located between the mesas 22 and the fingers 18 atop the mesas. These subjunctions are designated J1a.

In one form of the invention, a conductive clamping plate (not shown) is applied to the top of the overall thyristor to make contact with all of the cathode electrodes 19 and thus, to form a terminal for the thyristor connecting all of the cathode electrodes 19 in parallel in the external power circuit in which the thyristor is connected. This parallel connection is schematically depicted at 24 in FIG. 3. The anode electrode 14 is suitably bonded to a circular plate (not shown) of tungsten or molybdenum or the like to form a terminal for connecting the anode in the external circuit indicated at 25. This anode connecting structure can be the usual tungsten or molybdenum plate structure that is used for the anode connection in conventional high current thyristors.

Referring to FIG. 3, in the illustrated thyristor, the base layer 12 that is contiguous with the cathode layer 11 serves as a gate layer. This gate layer 12 has a surface region 27 adjacent the cathode layer 11 that is not covered by the cathode layer. Covering this surface region 27 and in ohmic contact therewith is a thin metallic coating 30, preferably of aluminum, that extends over the entire upper face of the silicon disc 9 except for the regions occupied by the mesas 22 and a narrow marginal region 32 surrounding the base of each of these mesas. The metallic coating 30 acts as a gate electrode for the thyristor, as will soon be explained.

Figure 4:
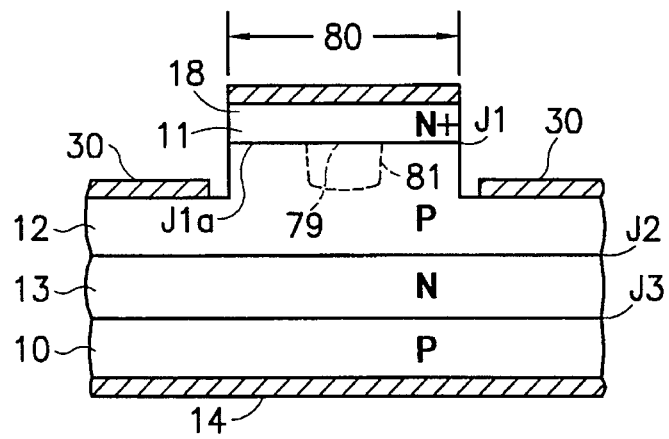
FIG. 4 depicts in enlarged and more detailed form a portion of the sectional view of FIG. 3.

Each of the cathode-layer fingers 18 acts as the cathode layer of a miniature thyristor (depicted in FIG. 4) comprising the finger 18 as the top N layer and the portions of layers 12, 13 and 10 therebeneath as P, N, P layers, respectively. These miniature thyristors are all effectively connected in parallel and together constitute the main current-carrying portion of the overall thyristor, designated 8.

When the anode 14 of the overall thyristor is positive with respect to the cathode 19, no appreciable current flows between the anode and cathode unless a gating signal is applied between the gate 30 and the cathode 19. But when an appropriate gating signal that produces a predetermined minimum current flowing from gate to cathode via subjunction J1a in each miniature thyristor is applied, each miniature thyristor switches "on" and current flows between its anode and cathode. The triggering circuit for producing this gate-to-cathode current is conventional and is not shown in the drawings.

After the overall thyristor 8 has become conducting, it can be turned off by shorting out (or developing a low-resistance bypass around) its base-to-emitter junction J1. For performing this function, a MOS type field-effect transistor (MOSFET) 40 is relied upon in the embodiment of FIGS. 1–3. The MOSFET 40 is connected between the cathode electrode 19 and the gate electrode 30. When the thyristor 8 is in its "on" state, the MOSFET 40 has a high resistance and essentially no current flows therethrough. When an appropriate voltage signal is applied to the MOSFET 40, it switches to a low-resistance state, thus developing a low-resistance bypass, or short, around the junction J1, thus turning off the thyristor.

Figure 5:
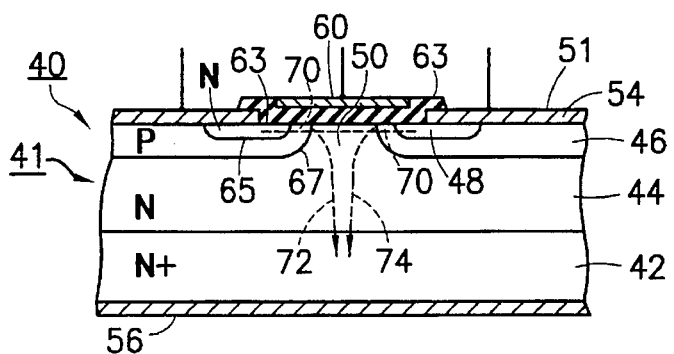
FIG. 5 is an enlarged sectional view showing a MOS-type field-effect transistor (MOSFET) constituting a portion of the thyristor of FIGS. 1–4.

The field-effect transistor 40 can be of a conventional form, such as illustrated in FIG. 5, where one cell of a multicell MOSFET 40 is depicted. This MOSFET 40 comprises a multilayer silicon body 41 having four superposed layers 42, 44, 46, and 48. The bottom layer 42 is of heavily doped N type silicon; the next higher layer 44 is of N type silicon; the next higher layer 46 is of P type silicon; and the top layer 48 is of N type silicon. The intermediate layer 44 has a portion 50 projecting through the layers 46 and 48 to the top surface 51 of the silicon body. The layer 46 surrounds projecting portion 50 and extends to the top Surface 51 of the silicon body, and the layer 48 is of annular configuration and extends from the top surface 51 into the layer 46. Layer 48 also surrounds projecting portion 50 of layer 44, being separated from projecting portion 50 by a portion of layer 46.

There is a first PN junction 65 between layer 48 and layer 46 and a second PN junction 67 between layer 46 and portion 50 of layer 44.

Atop the silicon body 41 is an annular source electrode 54 that is in ohmic contact with the top surfaces of silicon layers 46 and 48. Beneath the silicon body 41 is a drain electrode 56 in ohmic contact with the bottom surface of silicon layer 42. The source electrode 54 is connected to the cathode electrode 19 of the thyristor, and the drain electrode is connected to the gate electrode 30 of the thyristor.

Adjacent the top surface 51 of the silicon body 41 of the MOSFET 40 is a gate contact 60 that is separated from the top surface by a thin coating 63 of oxide-type electrical insulating material. This gate contact 60 extends across the projecting portion 50 and spans the two PN junctions 65 and 67.

Referring still to FIG. 5, when a positive charge is applied to the gate contact 60, it develops an N type inversion layer in the P layer 46 adjacent the contact 60. This inversion layer 70 effectively bypasses the two PN junctions 65 and 67, allowing current to flow between the source electrode 54 and the drain electrode 56 via paths 72 and 74 extending through the inversion layer 70. These paths 72, 74 are low-resistance paths that effectively short out the upper base-to-emitter junction J1 of the thyristor, thus turning off the thyristor.

It is important that the shorting device, (e.g., MOSFET 40), upon operation, establish one or more paths of very low resistance since the resistance of the shorting paths largely determines the portion of the main current through the thyristor that is diverted from the PN subjunction(s) J1a of the thyristor and through the shorting path(s). My studies of this matter indicate that at least 10% of the anode current should be diverted through the shorting paths established by the shorting device, e.g. MOSFET 40, in order to produce effective turn-off of the thyristor when high anode currents are passing through the thyristor.

While FIGS. 1 and 3 show a single field-effect transistor 40 connected between the gate electrode 30 and cathode electrode 19 adjacent the center line of the thyristor 8, it is to be understood that more than one such transistor can be connected between these electrodes at this same location or at other locations on the thyristor (e.g., near the outer periphery of the thyristor or at a combination of these locations). If more than one field-effect transistor is used, the transistors and the turn-on circuitry therefor should be such that turn-on of the transistors is effected substantially simultaneously so that the transistors are able, without delay, to share the current diverted from the bypassed PN subjunctions and effectively limit the resistance of the bypass when turned on. The location of the transistors should be such that the leads connecting each of them between the cathode and gate electrodes are a near-minimum in length, thus holding to a near-minimum the resistance and inductance of these leads and rendering the transistors 40 more effective in establishing a low impedance bypass around the subjunctions J1a when turned on.

An advantage of the disclosed construction is that the field-effect transistor(s) 40 are discrete devices separate from the rest of the thyristor and, accordingly, can be fabricated separately from the rest of the thyristor. These transistors 40 require for their manufacture integrated-circuit fabricating procedures that are expensive to employ because of precision and cleanliness requirements. The main current-carrying portion of the thyristor can be fabricated by procedures that are considerably less demanding from a precision and cleanliness standpoint. This enables me to make the main current-carrying portion of the thyristor in facilities already in place for the manufacture of power thyristors and to obtain the field-effect transistors from already-established sources for such transistors.

It is to be noted that the field-effect transistor 40 in the illustrated thyristor is in a location separate from the fingers 18. This enables the separately-manufactured field-effect transistor 40 to be easily incorporated into the thyristor. If additional field-effect transistors electrically paralleling the illustrated transistor are employed, these too are positioned in locations separate from the fingers 18.

Figure 7:
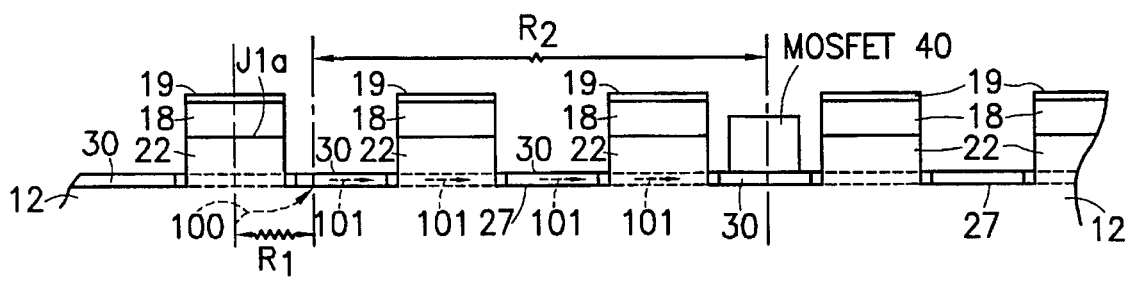
FIG. 7 is an enlarged sectional view similar to FIG. 3 but showing certain additional parts schematically.

By employing for the main current-carrying portion of the thyristor a structure in which the gate electrode (30) covers most of the wafer surface 27 where the MOSFET 40 is located, I can locate the MOSFET anywhere on this surface without substantially changing the resistance of the bypass developed around the PN subjunctions J1a when the MOSFET is turned on. To illustrate this point, reference may be had to the enlarged schematic view of FIG. 7 in connection with the following discussion. Irrespective of where the MOSFET 40 of FIG. 7 is located on surface 27, the net current (depicted by dotted line arrow 100) diverted from a PN subjunction J1a by turn-on of the MOSFET is required to flow laterally of the semiconductor layer 12 only from the center line of the subjunction to the gate electrode 30 surrounding the projection, or mesa, 22. From that point to the MOSFET, the current path (101) is laterally through the gate electrode 30. Since the gate electrode 30 is of highly conductive metal, e.g., aluminum, and presents a large cross-section to such laterally-flowing current, the resistance R2 presented by the gate electrode to such laterally-flowing current is tiny compared to the resistance R1 presented by the semiconductor material of the layer 12. Accordingly, even if the current path through the gate electrode might be longer than is illustrated in FIG. 7 because the MOSFET 40 might be located further away from the left-hand subjunction than is shown in FIG. 7, the total resistance R1+R2 of the path leading to the MOSFET is increased only by a negligible amount since R2, even if substantially increased, is still tiny compared to the unchanged R1.

In a preferred form of the invention, each of the subjunctions J1a has a substantially lower avalanche voltage (i.e., at least 4 volts lower) centrally of the subjunction than at its outer edge. In one form of the invention, the central region of the subjunction is made to have an avalanche voltage of about 15 to 20 volts, and the remainder of the subjunction is made to have an avalanche voltage of about 25 to 35 volts. This feature reduces the susceptibility of the subjunction J1a to avalanching in a mode that can retrigger into conduction the miniature thyristor of which it is a part immediately following turn-off of the current through the miniature thyristor. A similar feature is present in the gate turn-off thyristor of my aforesaid U.S. Pat. No. 5,005,065, and reference may be had to that patent for a more detailed explanation of this particular feature.

Figure 6:
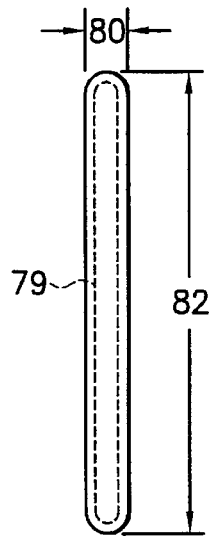
FIG. 6 is a plan view, on an enlarged scale, of a cathode-layer finger included in the embodiment of FIG. 4.

Referring to FIG. 6, in one embodiment of the invention, the cathode layer fingers each have a width 80 of 6 mils, and the low-avalanche voltage central region 79 of each subjunction J1a has a width of 2 mils. The length of each finger is about 100 mils, and the central region extends along most of this length but terminates about 2 mils from each end of the finger. Thus, there is a subjunction region of relatively higher avalanche voltage about 2 mils in width around the entire perimeter of the central region 79.

The desired reduction in avalanche voltage at the central region 79 is achieved by increasing the concentration of P type impurities in a localized zone 81 of the P layer 12 located immediately beneath the central region 79. Several ways of producing this increased concentration are disclosed in my above-referenced U.S. Pat. No 5,005,065.

Figure 8:
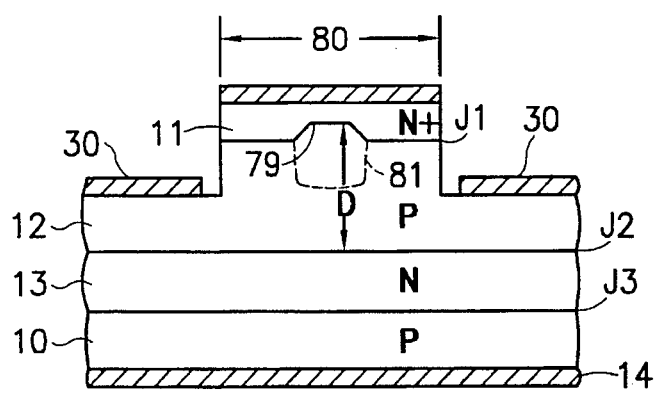
FIG. 8 is a sectional view similar to FIG. 4 but showing a modified embodiment of the invention.

Another way of reducing the susceptibility of the subjunction J1a to avalanching in a mode that, immediately following current turn-off, can retrigger into conduction the associated miniature thyristor is by decreasing the electron-injection efficiency in the central region 79 of subjunction J1a. One way that this can be done is by providing a subjunction J1a having the cross-sectional configuration depicted in FIG. 8, i.e., one in which the central region 79 of the subjunction J1a is located a greater distance D from the middle junction J2 than are the edge portions of subjunction J1a. Generally speaking, the farther away any portion of subjunction J1a is from junction J2, the lower the electron-injection efficiency of such portion.

Another way of decreasing the electron-injection efficiency in the central region of the subjunction J1a in order to enhance the turn-off capabilities of the thyristor is to reduce the lifetime of the conduction carriers in this central region. This can be done by locally diffusing a lifetime-killing impurity such as platinum into the central region 81 of the P type gate layer 12 or by suitably locally irradiating this region. Either of these techniques, which are also described in my U.S. Pat. No. 5,005,065, can be used alone or in combination with the techniques described in the two immediately-preceding paragraphs.

While particular embodiments of the invention have been shown and described, it will be obvious to those skilled in the art that various changes and modifications may be made without departing from the invention in its broader aspects; and it is therefore intended herein to cover all such changes and modifications as fall within the true spirit and scope of the invention.

What is claimed as new is:

1. A MOS-controlled thyristor comprising:

(a) a multi-layer semiconductor body having at least four layers, with contiguous layers being of different P and N conductivity types and with at least three back-to-back PN junctions between contiguous layers; one end layer constituting an anode layer, an opposite end layer constituting a cathode layer, and an intermediate layer contiguous with said cathode layer constituting a gate layer; said cathode layer being divided into many elongated fingers, thereby dividing the PN junction between said cathode layer and said gate layer into many discrete PN subjunctions between said fingers and said gate layer which are effectively in parallel which each other so as to share the current through said thyristor when said thyristor is "on"; said gate layer having predetermined surface regions adjacent said cathode layer but uncovered by said cathode-layer fingers and respectively surrounding the PN subjunctions between said fingers and the gate layer;

(b) an anode electrode in ohmic contact with said anode layer, (c) a cathode electrode having portions respectively registering with and in ohmic contact with said fingers, (d) a gate electrode in ohmic contact with said gate layer in said predetermined surface regions of said gate layer, said gate electrode surrounding the PN subjunctions between said fingers and the gate layers, and (e) a MOS field-effect transistor connected between said cathode electrode and said gate electrode and being located in a separate area of the thyristor from said fingers, said MOS field-effect transistor having a high-resistance state when the thyristor is "on" and being switchable into a low-resistance "on" state, thereby developing a low-resistance bypass around said PN subjunctions and turning off said thyristor upon being switched into said low-resistance "on" state.

2. The thyristor of claim 1 in which one or more additional field-effect transistors having a high-resistance state when the thyristor is "on" are connected between said cathode electrode and said gate electrode and are located in separate areas of the thyristor from said fingers, said field-effect transistors being switchable substantially in unison into a low-resistance "on" state, thereby developing a low resistance bypass around said PN subjunctions and turning off said thyristor upon being switched into said "on" state.

3. A thyristor comprising:

(a) a multi-layer semiconductor body having at least four layers, with contiguous layers being of different P and N conductivity types and with at least three back-to-back PN junctions between contiguous layers; one end layer constituting an anode layer, an opposite end layer constituting a cathode layer, and an intermediate layer contiguous with said cathode layer constituting a gate layer; said cathode layer being divided into many elongated fingers, thereby dividing the PN junction between said cathode layer and said gate layer into many discrete PN subjunctions between said fingers and said gate layer which are effectively in parallel with each other so as to share the current through said thyristor when said thyristor is "on"; said gate layer having predetermined surface regions adjacent said cathode layer but uncovered by said cathode-layer fingers and respectively surrounding the PN subjunctions between said fingers and the gate layer;

(b) an anode electrode in ohmic contact with said anode layer, (c) a cathode electrode having portions respectively registering with and in ohmic contact with said fingers, (d) a gate electrode in ohmic contact with said gate layer in said predetermined surface regions of said gate layer, said gate electrode surrounding the PN subjunctions between said fingers and the gate layer, and (e) a solid-state switching device connected between said cathode electrode and said gate electrode and being located in a separate area of said thyristor from said fingers, said switching device having a high-resistance state when the thyristor is "on" and being switchable to a low-resistance "on" state, thereby developing a low-resistance bypass around said PN subjunctions and turning off said thyristor upon being switched into said low-resistance "on" state.

4. The thyristor of claim 3 in which said solid-state switching device has a resistance in its "on" state sufficiently low to divert at least 10 percent of the anode current passing through said thyristor into one or more paths bypassing said subjunctions upon being switched into its "on" state.

5. The thyristor of claim 3 in which each of said PN subjunctions has a region located centrally of said subjunction that is characterized by a substantially lower avalanche voltage than characterizes the region of said PN subjunction that surrounds said centrally-located region.

6. The thyristor of claim 3 in which each of said PN subjunctions has a region located centrally of said subjunction that is characterized by an avalanche voltage at least 4 volts lower than characterizes the region of said PN subjunction surrounding said centrally-located region.

7. The thyristor of claim 3 in which each of said PN subjunctions has a region located centrally of said subjunction that is characterized by a lower electron-injection efficiency than characterizes the region of said subjunction that surrounds said centrally-located region.

8. The thyristor of claim 7 in which said gate layer includes in its region immediately adjacent said central region of each of said PN subjunctions a zone in which the conduction carriers present are characterized by having a lifetime substantially shorter than characterizes the conductive carriers present in the zone of said gate layer immediately adjacent the region of said PN subjunction that surrounds said centrally-located region.

9. The thyristor of claim 7 in which:

(a) the PN junction between said gate layer and an intermediate layer adjacent thereto constitutes a middle PN junction of the thyristor, and (b) most of the central region of each subjunction is located a greater distance from said middle PN junction of the thyristor than is the region of said PN subjunction that surrounds said central region.

10. The thyristor of claim 3 in which:
(a) aligned with each subjunction, the gate layer has a portion projecting from the surface of the gate layer that is in ohmic contact with said gate electrode, and
(b) one said cathode layer fingers is located at the outer end of each said projecting portion.

* * * * *

UNITED STATES PATENT AND TRADEMARK OFFICE
CERTIFICATE OF CORRECTION

PATENT NO. : 5,614,737
DATED      : March 25, 1997
INVENTOR(S): Dante E. Piccone It is certified that error appears in the above-identified patent and that said Letters Patent is hereby corrected as shown below:

On the title page, item [56] line 2 of the subject matter appearing under the heading "OTHER PUBLICATIONS", column 1, cancel "No Date." and substitute therefor: -- Power Conversion Intelligent Motion, Nov. 1992, pp. 9-16 --

On the title page item [56] 1 line 3 of the subject matter appearing under the heading "OTHER PUBLICATIONS", column 1, cancel "Power Conversion Intelligent Motion, Nov. 1992, pp. 9-16."

Signed and Sealed this

Twenty-seventh Day of July, 1999

Attest:

Q. TODD DICKINSON

*Attesting Officer*    *Acting Commissioner of Patents and Trademarks*